United States Patent [19]

Owens

[11] Patent Number: 4,816,896
[45] Date of Patent: Mar. 28, 1989

[54] COMPLIANT STANDOFF FOR SEMICONDUCTOR PACKAGES

[75] Inventor: Norman L. Owens, Tempe, Ariz.

[73] Assignee: Motorola Inc., Schaumburg, Ill.

[21] Appl. No.: 150,868

[22] Filed: Feb. 1, 1988

[51] Int. Cl.⁴ .................. H01L 23/12; H01L 23/14
[52] U.S. Cl. ............................. 357/74; 357/72; 357/68
[58] Field of Search ..................... 357/72, 74, 68

[56] References Cited

U.S. PATENT DOCUMENTS 4,742,385  5/1988  Kohmoto ........................ 357/74

FOREIGN PATENT DOCUMENTS 0228739  12/1984  Japan ........................ 357/74
0038845   2/1985  Japan ........................ 357/74
0166147   7/1986  Japan ........................ 357/74

*Primary Examiner*—Andrew J. James
*Assistant Examiner*—S. V. Clark
*Attorney, Agent, or Firm*—Harry A. Wolin; Raymond J. Warren

[57] ABSTRACT

Described herein is a standoff for use with semiconductor packages to prevent chipping. The standoff is designed to fit over a pin of the package and seat on the package surface with a portion extending over the corner of the package.

20 Claims, 2 Drawing Sheets

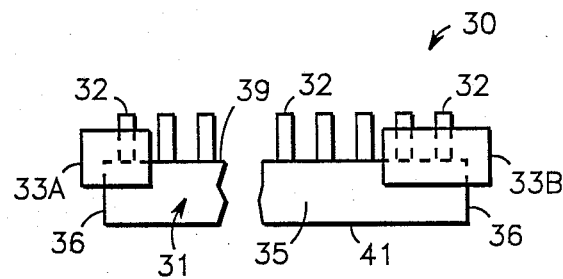
FIG. 4
FIG. 5
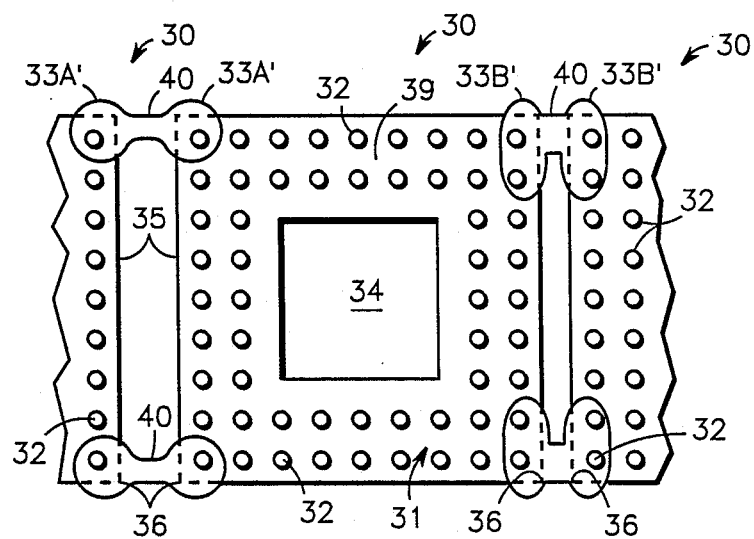

COMPLIANT STANDOFF FOR SEMICONDUCTOR PACKAGES

BACKGROUND OF THE INVENTION

The present invention relates, in general, to semiconductor packages and, more particularly, to compliant standoffs for semiconductor packages.

Currently, standoffs are commonly provided by metal rings which are brazed onto the pins of the package. A typical package would contain four standoffs located generally near each corner of the package. The standoffs ensure a space remains between the semiconductor package and the board or carrier upon which it is mounted. The main purpose of the standoffs is to: prevent shorts; provide relief from stresses; and to compensate for some mismatch between the package and the board.

A current problem faced by semiconductor package manufacturers, particularly for ceramic packages, is the tendency of these packages to crack. These cracks result primarily from the packages coming into contact with other packages or the processing equipment (e.g. mark, test, wire bond). In order to prevent these cracks, package manufacturers have chamferred the edges. Additionally, some manufactures have fabricated plastic bumpers which are affixed to the sides of packages. These bumpers prevent package-to-package contact. However, these do not provide any standoff features.

One problem encountered with chamfering is that it increases the cost of a package. In addition, due to the size and design of the package environment, some packages do not have enough room between the pins and the edge of the package to permit chamfering. Further, it is suspected that chamfering causes micro-cracks to develop in the package. These micro-cracks then become large cracks when the package is subjected to stresses.

Accordingly, it is an object of the present invention to provide a compliant standoff for semiconductor packages which overcomes the above deficiencies.

A further object of the present invention is to provide a compliant standoff which eliminates the need for chamfering packages.

Another object of the present invention is to provide a compliant standoff which prevents cracking and chipping of the packages.

Still another object of the present invention is to provide a compliant standoff which combines a standoff with a compliant spacer to prevent package cracking.

Yet another object of the present invention is to provide a compliant standoff which can be used to form a pseudo leadframe of semiconductor packages.

The above and other objects and advantages of the present invention are provided by the compliant standoff described herein.

SUMMARY OF THE INVENTION

A particular embodiment of the present invention consists of a compliant standoff made of plastic. The standoff is designed to slip over a pin of a package, such as a pin grid array package, and seat on the package with a portion of the standoff extending over the corner of the package. This prevents package to package contact during shipping or processing.

BRIEF DESCRIPTION OF THE DRAWINGS

FIG. 4 is a side view of a semiconductor package having a compliant standoff embodying the present invention; and FIG. 5 is a top view of pseudo leadframe comprising a compliant standoff embodying the present invention.

DETAILED DESCRIPTION OF THE DRAWINGS

Figure 1:
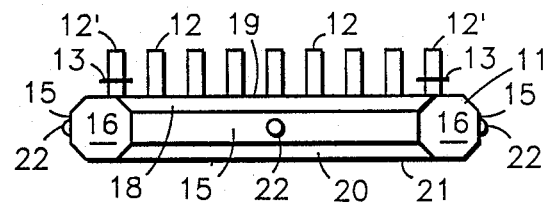
FIG. 1 is a side view of a prior art semiconductor package illustrating prior art bumpers, chamfering, and standoffs.
Figure 2:
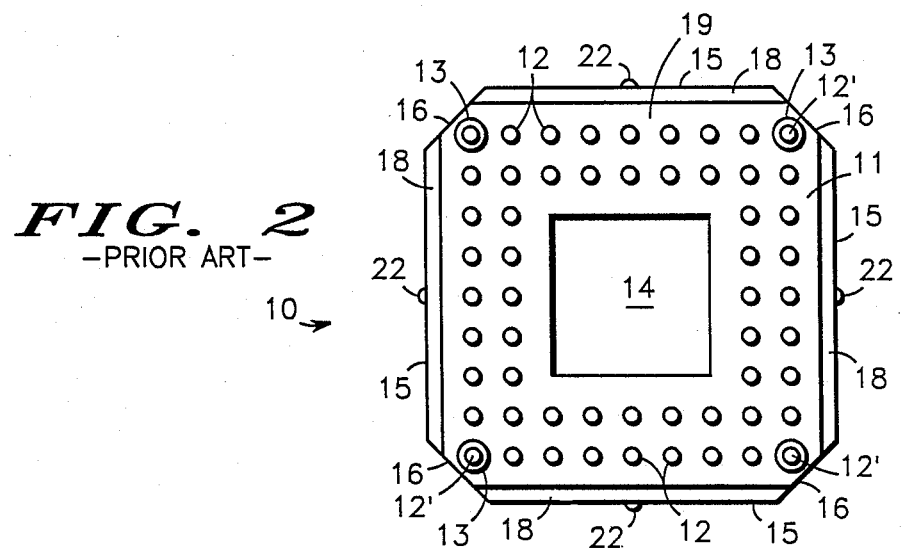
FIG. 2 is a top view of the prior art semiconductor package of FIG. 1.

Referring first to FIGS. 1 and 2, side and top views, respectively, of a semiconductor package, generally designated 10, are illustrated having prior art bumpers, chamfering, and standoffs. Package 10 consists generally of a body 11 and pins 12. Package 10 also contains a die attach area 14 to which a die, not shown, is attached and bonded to leads contained in package 10.

At the corners of body 11, pins 12' are shown having a collar 13 attached thereto. Collar 13 is located a predetermined distance from body 11. As package 10 is inserted in a board, or the like, collar 13 provides a space, or standoff, between the board and body 11. Therefor, collar 13 is referred to as a standoff for package 10.

In order to prevent damage to package 10, the corners have been chamferred. Package 10 contains twelve corners which have been chamferred. A first set of four chamfers 16 are located where sides 15 had contacted. A second set of four chamfers 18 are located where sides 15 had contacted a top surface 19. A final set of four chamfers 20 are located where sides 15 had contacted bottom surface 21. These chamfers take a great deal of work and time to grind into package 10 and add to the expense of the package.

An alternative method of preventing cracks used in the prior art is placing bumpers on the sides of the package. A set of bumpers 22 is illustrated affixed to edges 15 of package 10. Bumpers 22 would prevent contact by sides 15 during side-to-side processing.

Figure 3:
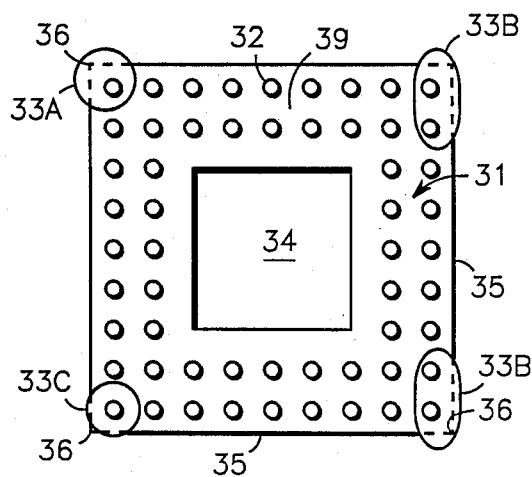
FIG. 3 is a top view of a semiconductor package having a compliant standoff embodying the present invention.

Referring now to FIGS. 3 and 4, a semiconductor package, generally designated 30, is illustrated. Package 30 consists generally of pins 32 and body 31, having: sides 35, a top surface 39, and a bottom surface 41. Package 30 also contains a die attach area 34 to which a die, not shown, is attached and bonded to leads contained in package 30.

Compliant standoffs 33a, 33b, and 33c are illustrated coupled to package 30. As shown, standoff 33a is designed to fit about a single pin 32 and extends partly over a corner 36 of package 30. Standoff 33a prevents corner 36 from being contacted by external elements, such as other packages or processing equipment. Standoff 33a can be comprised of: plastic, rubber, glass, pressed alumina, silicone, ceramic, etc. The primary concern of the material comprising standoff 33a is that it be electrically insulative.

The height of standoff 33a is approximately 120 mils on a package of 125 mils thickness. The 120 mil standoff 33a extends approximately 60 mils above surface 39 of body 31 and approximately 60 mils down corner 36. It should be noted that the height of standoff 33a can be adjusted to fit the need. Also, the amount of standoff 33a which extends down the side of package 30 may be adjusted to fit the need.

The second type of standoff, 33b, is shown being disposed about two pins 32. It was found that the design of standoff 33a often left some play between standoff 33a and sides 35, allowing standoff 33a to move. Standoff 33b has been enlarged and disposed about a second pin 32 in order to prevent movement that may result from space left between standoff 33b and sides 35.

The third type of standoff, 33c, is similar in shape to 33a but, is designed to only cover sides 35 adjacent corner 36 and not corner 36 itself. This provides the protection needed when packages 10 are disposed side-by-side.

As can be appreciated, having standoffs 33a, 33b, or 33c eliminates the need for chamfering the corners of package 30 and allows a smaller package to be used. This smaller package can reduce materials cost of production and assist in conserving space on circuit boards.

An additional feature of the present invention is the ability to make a pseudo leadframe. This feature is illustrated in FIG. 5. Here, a plurality of packages 30 are coupled together utilizing compliant standoffs 33a' or 33b'. As shown, a pair of standoffs 33a' or 33b', are coupled by a bridge 40. Bridge 40 acts to couple the plurality of packages 30 into a pseudo leadframe. The devices may be processed and/or shipped in this manner. It should be noted that if shipped in this manner, a shipping rail would still be utilized. Once ready to be used, bridges 40 are cut leaving packages 30 singulated and standoffs 33a' or 33b' intact.

Thus, it will be apparent to one skilled in the art that there has been provided in accordance with the invention, a device that fully satisfies the objects, aims, and advantages set forth above.

While the invention has been described in conjunction with specific embodiments thereof, it will be evident that many alterations, modifications, and variations will be apparent to those skilled in the art in light of the foregoing description. Accordingly, it is intended to embrace all such alterations, modifications, and variations in the appended claims.

I claim:

1. A standoff for use with a semiconductor package, said standoff comprising:
   a first portion being disposed about a pin of a first semiconductor package, said first portion having a first surface disposed partly against a first surface of said first semiconductor package and a second surface opposite said first surface; and
   a second portion being disposed partly about a side of said first semiconductor package, said second portion having a first surface coupled to said first surface of said first portion 2. The standoff of claim 1 wherein said second portion is further disposed partly about a corner of said first semiconductor package.

3. The standoff of claim 1 further comprising;
   a third portion being disposed about a pin of a second semiconductor package, said third portion having a first surface disposed partly against a first surface of said second semiconductor package and a second surface opposite said first surface;
   a fourth portion being disposed partly about a side of said second semiconductor package, said fourth portion having a first surface coupled to said first surface of said third portion; and
   bridge means for coupling said second portion to said fourth portion.

4. The standoff of claim 1 further comprising;
   a third portion being disposed about a pin of a second semiconductor package, said third portion having a first surface disposed partly against a first surface of said second semiconductor package and a second surface opposite said first surface;
   a fourth portion being disposed partly about a side of said second semiconductor package, said fourth portion having a first surface coupled to said first surface of said third portion; and
   bridge means for coupling said first portion to said third portion.

5. The standoff of claim 1 wherein said standoff is further comprised of plastic.

6. The standoff of claim 1 wherein said standoff is further comprised of ceramic.

7. The standoff of claim 1 wherein said standoff is further comprised of silicone.

8. The standoff of claim 1 wherein said standoff is further comprised of glass.

9. A standoff for use on a semiconductor package, said standoff comprising:
   a first portion being disposed about a plurality of pins of a first semiconductor package, said first portion having a first surface disposed partly against a first surface of said first semiconductor package and a second surface opposite said first surface: and
   a second portion being disposed partly about a corner of said first semiconductor package, said second portion having a first surface coupled to said first surface of said first portion.

10. The standoff of claim 9 further comprising;
    a third portion being disposed about a plurality of pins of a second semiconductor package, said third portion having a first surface disposed partly against a first surface of said second semiconductor package and a second surface opposite said first surface;
    a fourth portion being disposed partly about a corner of said second semiconductor package, said fourth portion having a first surface coupled to said first surface of said third portion; and
    bridge means for coupling said second portion to said fourth portion.

11. The standoff of claim 9 further comprising;
    a third portion being disposed about a plurality of pins of a second semiconductor package, said third portion having a first surface disposed partly against a first surface of said second semiconductor package and a second surface opposite said first surface;
    a fourth portion being disposed partly about a corner of said second semiconductor package, said fourth portion having a first surface coupled to said first surface of said third portion; and
    bridge means for coupling said first portion to said third portion.

12. The standoff of claim 9 wherein said standoff is further comprised of plastic.

13. The standoff of claim 9 wherein said standoff is further comprised of ceramic.

14. The standoff of claim 9 wherein said standoff is further comprised of silicone.

15. The standoff of claim 9 wherein said standoff is further comprised of glass.

16. A standoff for use on a semiconductor package, said standoff comprising:
   a first portion being disposed about a plurality of pins of a first semiconductor package, said first portion having a first surface disposed partly against a first surface of said first semiconductor package and a second surface opposite said first surface;
   a second portion being disposed partly about a corner of said first semiconductor package, said second portion having a first surface coupled to said first surface of said first portion;
   a third portion being disposed about a plurality of pins of a second semiconductor package, said third portion having a first surface disposed partly against a first surface of said second semiconductor package and a second surface opposite said first surface;
   a fourth portion being disposed partly about a corner of said second semiconductor package, said fourth portion having a first surface coupled to said first surface of said third portion; and
   bridge means for coupling at least one of said first or second portions to at least one of said third or fourth portions.

17. The standoff of claim 16 wherein said standoff is further comprised of plastic.

18. The standoff of claim 16 wherein said standoff is further comprised of ceramic.

19. The standoff of claim 16 wherein said standoff is further comprised of silicone.

20. The standoff of claim 16 wherein said standoff is further comprised of glass.

* * * * *